(12) United States Patent
Lie et al.

(10) Patent No.: US 11,499,419 B2
(45) Date of Patent: Nov. 15, 2022

(54) DATA RATE OPTIMIZATION AND SYNCHRONIZATION FOR MUD-PULSE TELEMETRY IN A WELLBORE

(71) Applicant: Halliburton Energy Services, Inc., Houston, TX (US)

(72) Inventors: Joni Polili Lie, The Woodlands, TX (US); Li Gao, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 98 days.

(21) Appl. No.: 17/065,017

(22) Filed: Oct. 7, 2020

(65) Prior Publication Data
US 2022/0106874 A1   Apr. 7, 2022

(51) Int. Cl.
*E21B 47/18*   (2012.01)
*E21B 47/06*   (2012.01)
*G01R 19/25*   (2006.01)

(52) U.S. Cl.
CPC .............. *E21B 47/18* (2013.01); *E21B 47/06* (2013.01); *G01R 19/2509* (2013.01)

(58) Field of Classification Search
CPC .......... E21B 47/18; E21B 47/06; E21B 47/20; E21B 47/22; E21B 47/24; G01R 19/2509
See application file for complete search history.

(56) References Cited

U.S. PATENT DOCUMENTS

| 8,792,304 | B2* | 7/2014 | Sugiura | E21B 47/18 |
| | | | | 340/854.3 |
| 9,612,360 | B2* | 4/2017 | Zenith | E21B 47/07 |
| 10,294,780 | B2 | 5/2019 | Barak | |
| 2003/0016164 | A1* | 1/2003 | Finke | E21B 47/22 |
| | | | | 340/854.3 |
| 2007/0177461 | A1* | 8/2007 | Marsh | E21B 47/20 |
| | | | | 367/81 |
| 2008/0074948 | A1* | 3/2008 | Reckmann | E21B 47/18 |
| | | | | 367/81 |
| 2009/0251331 | A1 | 10/2009 | Wassermann et al. | |
| 2010/0188253 | A1 | 7/2010 | Shearer | |

(Continued)

FOREIGN PATENT DOCUMENTS

EP   3332090 B1   4/2019

OTHER PUBLICATIONS

PCT App. No. PCT/US2020/054533, "International Search Report and Written Opinion", dated Jun. 25, 2021, 12 pages.

*Primary Examiner* — Adnan Aziz
(74) *Attorney, Agent, or Firm* — Kilpatrick Townsend & Stockton LLP

(57) ABSTRACT

A system is disclosed for optimizing mud-pulse communications in a wellbore. The system may include a mud pulser positionable in the wellbore and a surface detection system. The mud pulser can transmit a sequence of waveforms having various data rates to the surface detection system for synchronizing the mud pulser with the surface detection system. The surface detection system may receive the sequence of waveforms from the mud pulser and may determine one or more waveforms of the sequence of waveforms having amplitudes exceeding a predefined threshold. The surface detection system may then determine which of the one or more waveforms has a fastest data rate, and select the fastest data rate for use in subsequent communications with the mud pulser.

20 Claims, 10 Drawing Sheets

(56) References Cited

U.S. PATENT DOCUMENTS

| | | | |
|---|---|---|---|
| 2013/0250728 A1* | 9/2013 | Burgess | E21B 47/24 367/84 |
| 2014/0254322 A1* | 9/2014 | Tang | H03M 7/08 367/83 |
| 2017/0234124 A1 | 8/2017 | Dang | |
| 2017/0234125 A1 | 8/2017 | Zhang et al. | |
| 2017/0268331 A1* | 9/2017 | Lee | E21B 47/20 |
| 2019/0093468 A1* | 3/2019 | Aguirre | E21B 21/065 |

\* cited by examiner

DATA RATE OPTIMIZATION AND SYNCHRONIZATION FOR MUD-PULSE TELEMETRY IN A WELLBORE

TECHNICAL FIELD

The present disclosure relates generally to communications during wellbore operations and, more particularly (although not necessarily exclusively), to optimizing a data rate used in performing mud-pulse telemetry in a wellbore.

BACKGROUND

Wellbores can be formed by drilling operations that may penetrate a subterranean formation for extracting hydrocarbon products. During a drilling operation, mud may be pumped downhole by a mud pump into the wellbore for various reasons such as to remove cuttings from the wellbore, to cool a drill bit of the drilling operation, etc. The mud can also be used as a communications medium through which mud pulses can be transmitted from downhole to the surface, for example to convey measured information about downhole conditions. Communicating such data via mud pulses is referred to as mud-pulse telemetry.

DETAILED DESCRIPTION

Figure 1:
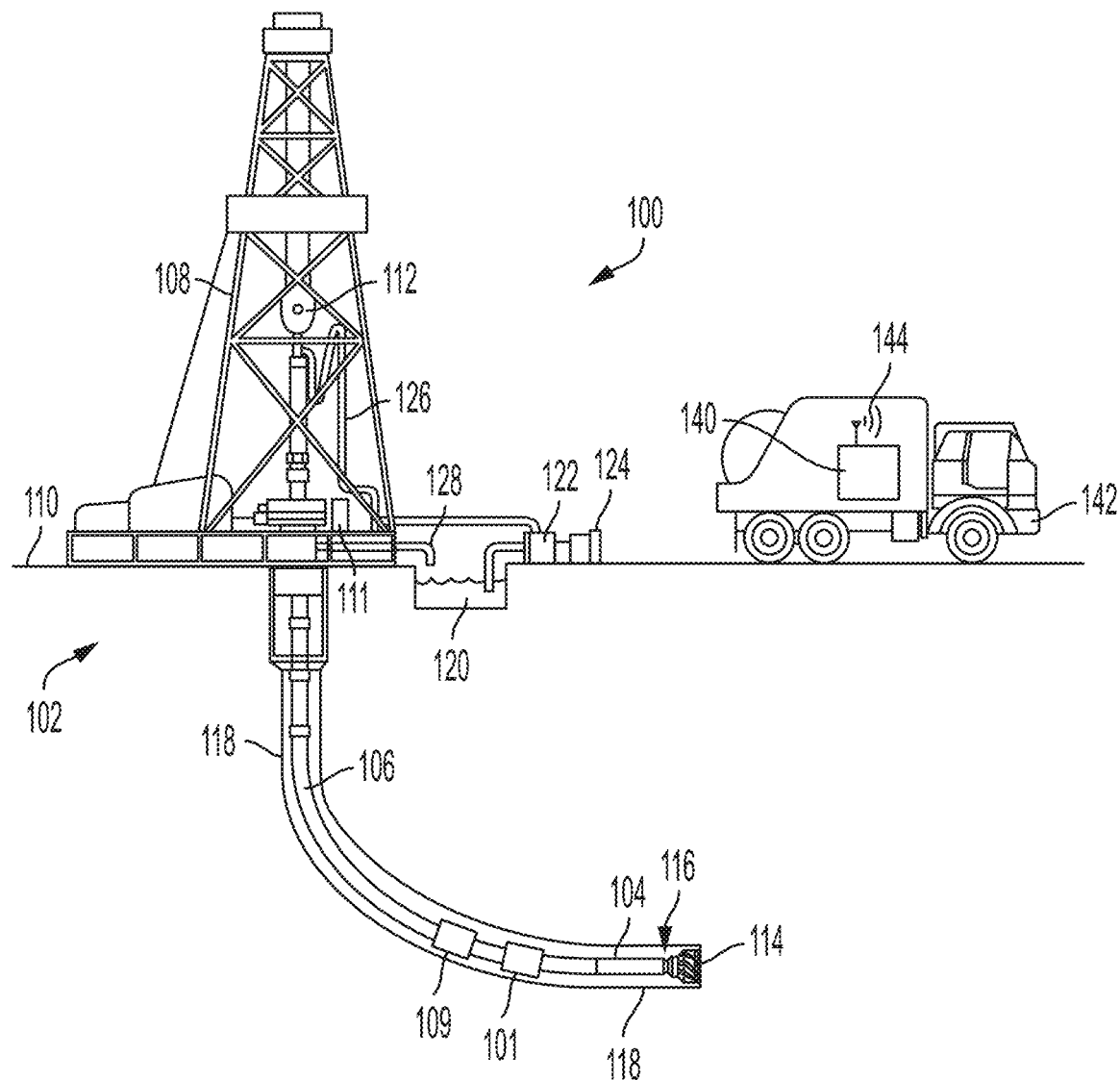
FIG. 1 shows a cross-sectional view of a wellbore with a computing system usable to optimize and synchronize a data rate of a mud pulser according to some examples of the present disclosure.

Certain aspects and examples of the present disclosure relate to optimizing a data rate with which a mud pulser located downhole in a wellbore is to communicate with a surface detection system located at a surface of the wellbore. The data rate may be a rate at which the mud pulser transmits data relating to mud conditions or other downhole conditions to the surface detection system. A computing device at the surface can determine the optimal data rate that maximizes an efficiency of communication between the mud pulser and the surface detection system. In particular, the computing device can select the optimal data rate from a set of data rates by analyzing a sequence of waveforms transmitted at different data rates from the mud pulser to the surface detection system. Upon determining the optimal data rate, the computing device can transmit a signal for causing mud pulser's data rate to be adjusted to the optimal data rate, so that the mud pulser uses the optimal data rate to transmit subsequent communications to the surface detection system.

During a drilling operation for drilling the wellbore, mud can be pumped downhole through a drill string using a mud pump. Upon initializing the mud pump, a mud pulser located on the drill string may transmit a sequence of waveforms in descending order of data rate to the surface detection system for synchronizing the mud pulser and the surface detection system. The mud pulser may pulse-width modulate and time modulate each waveform in the sequence of waveforms. These modulations may adjust each waveform in the sequence of waveforms and may make it easier or more efficient for the surface detection system to detect each waveform. In some examples, the pulse-width modulation and the time modulation may involve adjusting a width or an amplitude of a complementary Golay sequence. A complementary Golay sequence can include a pair of sequences that have aperiodic autocorrelation coefficients that sum to zero in out-of-phase positions. Additionally or alternatively, the time modulation may be based at least in part on a minimum pulse time, a bit width, and a pulse width for the mud pulser generating each waveform at a particular data rate.

Upon completing the pulse-width modulation and the time modulation, the mud pulser may transmit the sequence of waveforms to the surface detection system. The surface detection system may receive the sequence of waveforms and convey digital representations of the received sequence of waveforms to the computing device, which can pre-process the waveforms. Pre-processing the waveforms may involve autocorrelating each waveform, normalizing each waveform, or both. The autocorrelation may involve inserting a pre-set silence period into the waveform or using any other suitable autocorrelation function. The normalization may be performed based on a pre-set criterion such as normalizing to a unit-energy. After pre-processing the waveforms, the computing device may then apply a predetermined threshold to each waveform in the sequence of waveforms to determine which of the waveforms in the sequence of waveforms exceeds the predetermined threshold. In some examples, the predetermined threshold may be an amplitude threshold. Waveforms that are below the predetermined threshold may be filtered out or otherwise removed or ignored because their amplitudes may be too attenuated to allow for effective communication between the mud pulser and the surface detection system.

After identifying a subset of waveforms (e.g., one or more waveforms) in the sequence of waveforms having amplitudes that exceed the predefined threshold, the computing device can determine data rates for the waveforms in the subset. To determine the data rates, the computing device may determine an average data rate of the sequence of waveforms based at least in part on the pulse width, the minimum pulse time, and the bit width of each waveform of the sequence of waveforms. The average data rate can be a mean value of the data rates of the waveforms of the sequence of waveforms. The computing device may determine the average data rate and use the average data rate to calculate an actual data rate of each waveform of the sequence of waveforms. In some examples, the computing device may only calculate the average and actual data rates of waveforms of the sequence of waveforms having an amplitude greater than or equal to the predefined threshold, which may conserve computing resources. Based on the average data rate, the computing device can determine an actual data rate for each of the waveforms. In some examples, the computing device may determine an actual data rate for a waveform by dividing a difference of a beginning and an ending of the waveform by the average data rate. In some examples, the computing device may, in addition to using the calculated average data rate, adjust each waveform by removing at least one prime number multiplier from each waveform for determining the actual data rate for each waveform.

Having determined the data rates of the waveforms in the subset of waveforms with amplitudes meeting or exceeding the predefined threshold, the computing device can identify the fastest data rate and select the fastest data rate as an optimal data rate. Using the optimal data rate in communications between the mud pulser and the surface detection system may increase efficiency of the drilling operation or otherwise optimize the drilling operation. After identifying and selecting the optimal data rate, the computing device may transmit a command to the mud pulser to cause the mud pulser to configure itself to transmit future communications to the surface detection system at the optimal data rate. The computing device may also transmit a command for causing the surface detection system to use the optimal data rate when receiving the communications from the mud pulser, so that the data rates used by the mud pulser and the surface detection system are synchronized. In some examples, the above process may be repeated each time the mud pump initializes, with the mud pulser transmitting a sequence of waveforms to the surface detection system for synchronizing the mud pulser and the surface detection system each time.

The above illustrative examples are given to introduce the reader to the general subject matter discussed herein and are not intended to limit the scope of the disclosed concepts. The following sections describe various additional features and examples with reference to the drawings in which like numerals indicate like elements, and directional descriptions are used to describe the illustrative aspects, but, like the illustrative aspects, should not be used to limit the present disclosure.

FIG. 1 is a cross-sectional view of a wellbore-drilling system 100 including a wellbore 118 according to some examples of the present disclosure. The wellbore 118 can be used to extract hydrocarbons from a subterranean formation 102. The wellbore 118 can be drilled using the wellbore-drilling system 100. The wellbore-drilling system 100 may drive a bottom hole assembly (BHA) 104 positioned or otherwise arranged at the bottom of a drill-string 106 extended into the subterranean formation 102 from a derrick 108 arranged at the surface 110. The derrick 108 includes a kelly 112 used to lower and raise the drill-string 106.

The BHA 104 may include a drill bit 114 operatively coupled to a tool string 116, which may be moved axially within a drilled wellbore 118 as attached to the drill-string 106. The tool string 116 may include one or more sensors 109 for determining conditions in the wellbore 118. The sensors 109 may be part of a measurement unit that may be deployable downhole in the wellbore 118 and may sense data relating to mud conditions or any other suitable downhole data. The measurement unit can work in tandem with a mud pulser 101 to transmit mud pulses (e.g., in real-time) conveying the information detected by the sensors 109 to a surface detection system 111 at the surface 110. The combination of any support structure (in this example, the derrick 108), any motors, electrical equipment, and support for the drill-string and tool string may be referred to herein as a drilling arrangement.

During operation, the drill bit 114 penetrates the subterranean formation 102 to create the wellbore 118. The BHA 104 can control the drill bit 114 as the drill bit 114 advances into the subterranean formation 102. The combination of the BHA 104 and the drill bit 114 can be referred to as a drilling tool. Fluid or "mud" from a mud tank 120 may be pumped downhole using a mud pump 122 powered by an adjacent power source, such as a prime mover or motor 124. The mud may be pumped from the mud tank 120, through a stand pipe 126, which feeds the mud into the drill-string 106 and conveys the mud to the drill bit 114. The mud exits one or more nozzles (not shown) arranged in the drill bit 114 and thereby cools the drill bit 114. After exiting the drill bit 114, the mud circulates back to the surface 110 via the annulus defined between the wellbore 118 and the drill-string 106, thereby carrying the drill cuttings and debris to the surface. The cuttings and mud mixture are passed through a flow line 128 and are processed such that a cleaned mud is returned down hole through the stand pipe 126 once again.

A computing device 140 can be positioned belowground, aboveground, onsite, in a vehicle 142, offsite, etc. As shown in FIG. 1, the computing device 140 is positioned on the vehicle 142 at the surface 110. The computing device 140 can include a processor interfaced with other hardware via a bus. A memory, which can include any suitable tangible (and non-transitory) computer-readable medium, such as random-access memory ("RAM"), read-only memory ("ROM"), electrically erasable and programmable read-only memory ("EEPROM"), or the like, can embody program components that configure operation of the computing device 140. In some aspects, the computing device 140 can include input/output interface components (e.g., a display, printer, keyboard, touch-sensitive surface, and mouse) and additional storage. The computing device 140 can be communicatively coupled to the surface detection system 111. In some examples, the surface detection system 111 can include the computing device 140. In other examples, the computing device 140 may be wirelessly connected to the surface detection system 111.

The computing device 140 can include a communication device 144. The communication device 144 can represent one or more of any components that facilitate a network connection. In the example shown in FIG. 1, the communication devices 144 are wireless and can include wireless interfaces such as IEEE 802.11, Bluetooth™, or radio interfaces for accessing cellular telephone networks (e.g., transceiver/antenna for accessing a CDMA, GSM, UMTS, or other mobile communications network). In some examples, the communication device 144 can use acoustic waves, surface waves, vibrations, optical waves, or induction (e.g., magnetic induction) for engaging in wireless communications. In other examples, the communication device 144 can be wired and can include interfaces such as Ethernet, USB, IEEE 1394, or a fiber optic interface. In an example with at least one other computing device, the computing device 140 can receive wired or wireless communications from the other computing device and perform one or more tasks based on the communications.

The computing device 140 may be configured to perform various tasks associated with optimizing data rates for engaging in mud-pulse telemetry. For example, the mud pulser 101 may be configured to send a sequence of waveforms at different data rates to the surface detection system 111. The surface detection system 111 may receive the sequence of waveforms and subsequently transmit digital representations of the sequence of waveforms to the computing device 140, which can perform the various tasks for determining an optimal data rate at which to synchronize the mud pulser 101 and the surface detection system 111 based on the sequence of waveforms. Additional details about these tasks is provided below. In some examples, the surface detection system 111 may perform some of these tasks in parallel with, or instead of, the computing device 140.

Figure 2:
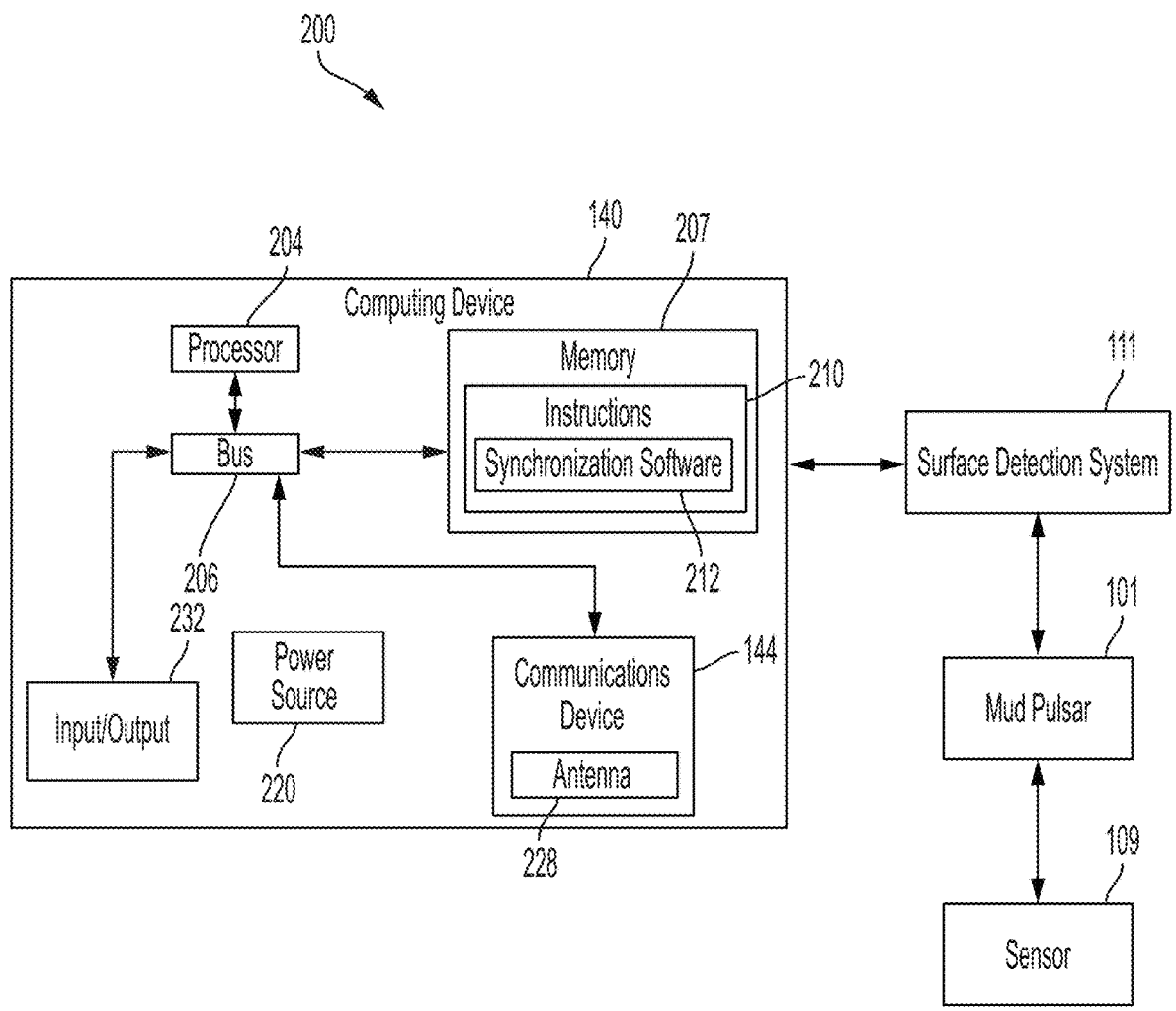
FIG. 2 shows a block diagram of a computing system for determining an optimal data rate for a mud pulser according to one example of the present disclosure.

FIG. 2 is a block diagram of a system 200 for determining an optimal data rate at which to transmit communications using a mud pulser according to some examples of the present disclosure. The components shown in FIG. 2 (e.g. the processor 204, memory 207, power source 220, and communications device 144) may be integrated into a single structure, such as within a single housing of a computing device 140. Alternatively, the components shown in FIG. 2 can be distributed from one another and in electrical communication with each other.

The system 200 may include the computing device 140. The computing device 140 can include a processor 204, a memory 207, and a bus 206. The processor 204 can execute one or more operations for identifying or otherwise determining an optimal data rate at which to transmit communications using the mud pulser 101. The processor 204 can execute instructions stored in the memory 207 to perform the operations. The processor 204 can include one processing device or multiple processing devices or cores. Non-limiting examples of the processor 204 include a Field-Programmable Gate Array ("FPGA"), an application-specific integrated circuit ("ASIC"), a microprocessor, etc.

The processor 204 can be communicatively coupled to the memory 207 via the bus 206. The non-volatile memory 207 may include any type of memory device that retains stored information when powered off. Non-limiting examples of the memory 207 may include EEPROM, flash memory, or any other type of non-volatile memory. In some examples, at least part of the memory 207 can include a medium from which the processor 204 can read instructions. A computer-readable medium can include electronic, optical, magnetic, or other storage devices capable of providing the processor 204 with computer-readable instructions or other program code. Non-limiting examples of a computer-readable medium include (but are not limited to) magnetic disk(s), memory chip(s), ROM, RAM, an ASIC, a configured processor, optical storage, or any other medium from which a computer processor can read instructions. The instructions can include processor-specific instructions generated by a compiler or an interpreter from code written in any suitable computer-programming language, including, for example, C, C++, C#, etc.

In some examples, the memory 207 can include computer program instructions 210 for determining the optimal data rate of the mud pulser 101 based on a sequence of waveforms transmitted by the mud pulser 101. For example, the instructions 210 can include synchronization software 212 that is executable by the processor 204 for causing the processor 204 to determine a fastest detected data-rate associated with a waveform included in the sequence of waveforms. The fastest detected data-rate can be the optimal data rate. The synchronization software 212 can then synchronize the mud pulser 101 and the surface detection system 111 to communicate at the fastest data rate.

The computing device 140 can include a power source 220. The power source 220 can be in electrical communication with the computing device 140 and the communications device 144. In some examples, the power source 220 can include a battery or an electrical cable (e.g., a wireline). The power source 220 can include an AC signal generator. The computing device 140 can operate the power source 220 to apply a transmission signal to the antenna 228 to generate electromagnetic waves that convey data relating to drilling parameters, drilling objectives, drilling operation results, etc. to other systems. For example, the computing device 140 can cause the power source 220 to apply a voltage with a frequency within a specific frequency range to the antenna 228. This can cause the antenna 228 to generate a wireless transmission. In other examples, the computing device 140, rather than the power source 220, can apply the transmission signal to the antenna 228 for generating the wireless transmission.

In some examples, part of the communications device 144 can be implemented in software. For example, the communications device 144 can include additional instructions stored in memory 207 for controlling functions of the communication device 144. The communications device 144 can receive signals from remote devices and transmit data to remote devices. For example, the communications device 144 can transmit wireless communications that are modulated by data via the antenna 228. In some examples, the communications device 144 can receive signals (e.g. associated with data to be transmitted) from the processor 204 and amplify, filter, modulate, frequency shift, or otherwise manipulate the signals. In some examples, the communications device 144 can transmit the manipulated signals to the antenna 228. The antenna 228 can receive the manipulated signals and responsively generate wireless communications that carry the data.

The computing device 140 in this example additionally includes an input/output interface 232. The input/output interface 232 can connect to a keyboard, pointing device, display, and other computer input/output devices. An operator may provide input using the input/output interface 232. Detected data rates of waveforms included in the sequence of waveforms can be displayed to an operator of the drilling operation through a display that is connected to or is part of the input/output interface 232. The displayed values can be observed by the operator, or by a supervisor of the drilling operation, who can make adjustments based on the displayed values.

As illustrated in the system 200, the computing device 140 is communicatively coupled to a surface detection system 111, but in other examples, the computing device 140 may be part of the surface detection system 111. The surface detection system 111 may include one or more sensors that can detect signals from the mud pulser 101. The sensors may be pressure sensors that are configured to detect pressure pulses. The surface detection system 111 can be disposed at the surface 110 of the wellbore-drilling system 100 and may be configured to receive sequences of waveforms from the mud pulser 101.

The mud pulser 101 can be disposed downhole in the wellbore 118 and can be communicatively coupled to the surface detection system 111 within the system 200. The mud pulser 101 may be configured to generate and transmit sequences of waveforms to the surface detection system 111. The mud pulser 101 may additionally be communicatively coupled to the sensor 109 that may transmit data about downhole conditions in the wellbore 118 to the mud pulser 101.

Figure 3:
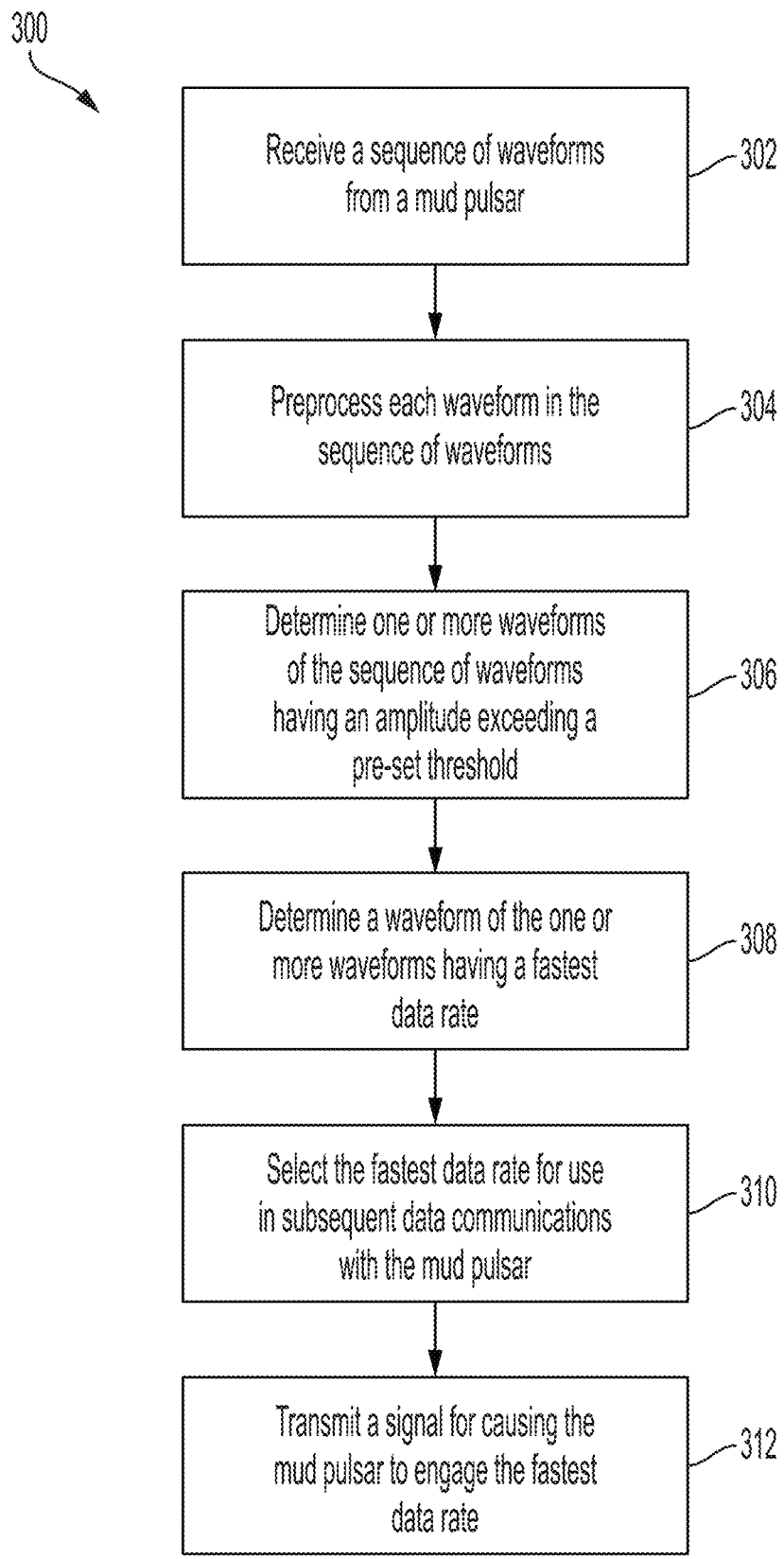
FIG. 3 shows a flow chart of a process to optimize a data rate of a mud pulser according to some examples of the present disclosure.

FIG. 3 is a flow chart of an example of a process 300 to optimize a data rate of a mud pulser 101 according to some examples of the present disclosure. Other examples may involve more steps, fewer steps, different steps, or a different combination of steps than is shown in FIG. 3. The below steps are described with reference to the components of FIGS. 1-2 described above.

At block 302, the surface detection system 111 receives a sequence of waveforms from the mud pulser 101. The mud pulser 101 may transmit the sequence of waveforms to the surface detection system 111 located at the surface 110. The sequence of waveforms may include a set of waveforms, with each waveform in the set of waveforms having a different data rate and being composed of a complementary Golay sequence. Each waveform of the sequence of waveforms may additionally have different or otherwise varying amplitudes.

At block 304, the computing device 140 preprocesses each waveform in the sequence of waveforms. Some pre-processing operations may include autocorrelation, normalization, identifying waveform amplitudes, or any other suitable pre-processing operations. In some examples, pre-processing the waveforms may filter out at least one waveform of the sequence of waveforms. In other examples, pre-processing the waveforms may involve adjusting each waveform for easier or more efficient detection of each waveform.

At block 306, the computing device 140 determines one or more waveforms in the sequence of waveforms that have an amplitude exceeding a predefined threshold. The predefined threshold may be input by an operator of the wellbore-drilling system 100, or, in some examples, the predefined threshold may be determined by the surface detection system 111 at least in part by considering historical data about existing wellbores. The predefined threshold may be a predefined amplitude, where waveforms having an amplitude under the predefined threshold can be removed from the sequence of waveforms or otherwise ignored by the computing device 140. In some examples, multiple waveforms in the sequence of waveforms may have amplitudes that meet or exceed the predefined threshold. In other examples, no waveforms in the sequence of waveforms may have amplitudes that meet or exceed the predefined threshold.

At block 308, the computing device 140 determines a waveform of the one or more waveforms having an amplitude exceeding the predefined threshold that has a fastest data rate. The computing device 140 can compare the data rates of the one or more waveforms and determine, among the one or more waveforms, the waveform having the fastest data rate. It may be desirable to use the fastest data rate for subsequent mud-pulse communications may be because the fastest data rate may allow for the largest amount of data to be communicated between the mud pulser and the surface detection system in the shortest amount of time.

At block 310, the computing device 140 selects the fastest data rate for use in subsequent communications between the surface detection system 111 and the mud pulser 101. The fastest data rate may be the optimal data rate, and using the fastest or optimal data rate may improve efficiency of data communications relating to the drilling operation, which may for example allow for better real-time control over the drilling operation.

At block 312, the computing device 140 transmits a signal for causing the mud pulser 101 to engage the fastest data rate. The signal can be transmitted using any suitable wireless communications technique, such as mud pulse transmissions, acoustic transmissions, vibratory transmissions, etc. Engaging the fastest data rate may involve adjusting a configurable setting for causing the mud pulser 101 to transmit future communications using the fastest data rate. In one particular example, the surface detection system 111 may transmit a command to the mud pulser 101 downhole in the wellbore for causing the mud pulser 101 to adjust itself and engage the fastest data rate. The mud pulser 101 may receive the command and engage the fastest data rate, which can result in the mud pulser 101 and the surface detection system 111 having synchronized data rates for subsequent communications.

Figure 4:
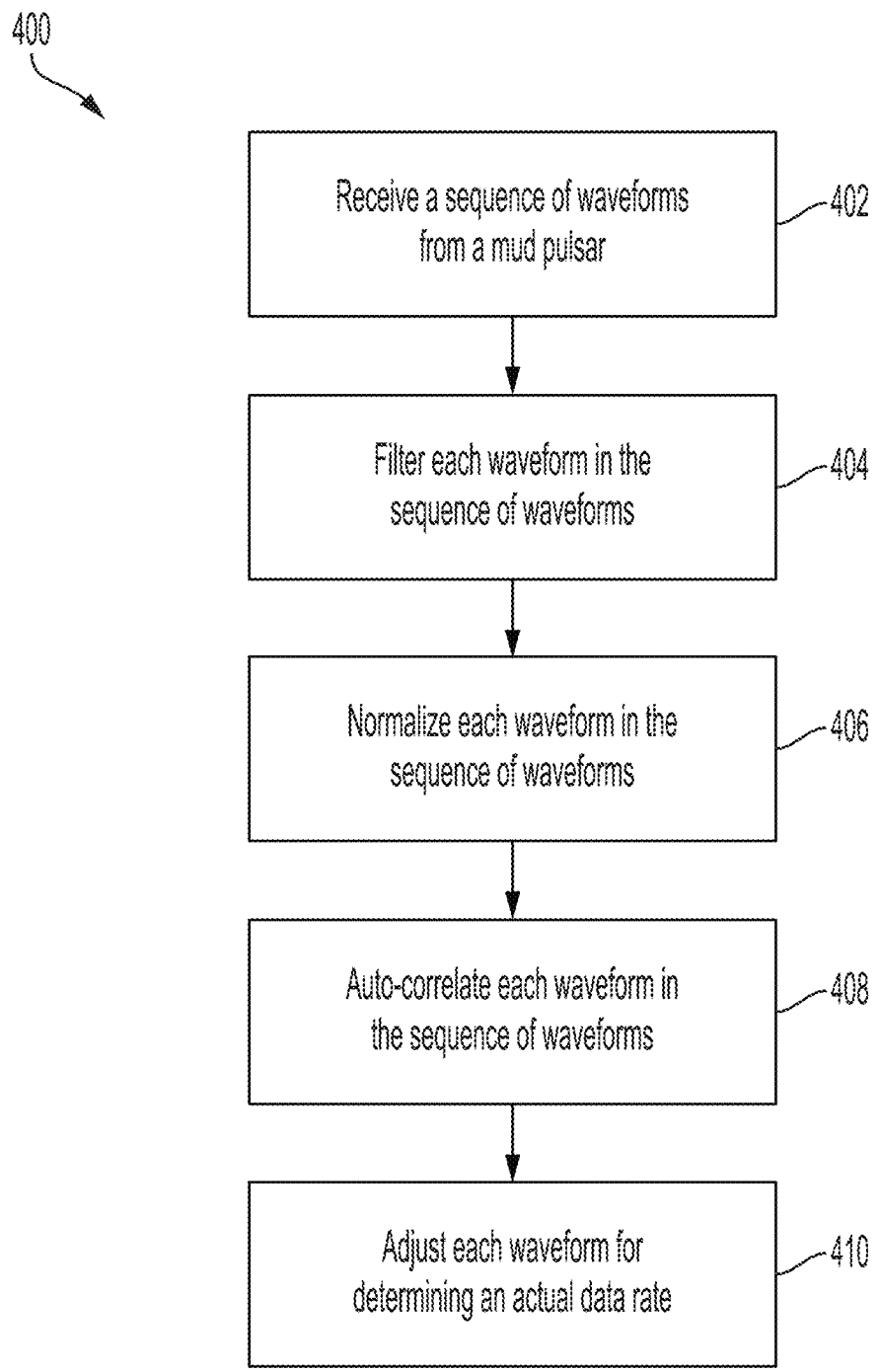
FIG. 4 shows a flow chart of a process for pre-processing a set of waveforms according to some examples of the present disclosure.

FIG. 4 is a flow chart of a process 400 for pre-processing a set of waveforms according to some examples of the present disclosure. In some examples, the steps of FIG. 4 are sub-steps of the block 304 of process 300 for pre-processing waveforms. Other examples of flow charts may involve more steps, fewer steps, different steps, or a different combination of steps than is shown in FIG. 4. The below steps are described with reference to the components of FIGS. 1-2 described above.

At block 402, the surface detection system 111 receives a sequence of waveforms from the mud pulser 101. The mud pulser 101 may transmit the sequence of waveforms to the surface detection system 111 located at the surface 110. The sequence of waveforms may include a set of waveforms, with each waveform in the set of waveforms being transmitted at a different actual data rate. The surface detection system 111 may convert the sequence of waveforms into digital form, and transmit the digital representations of the sequence of waveforms to the computing device 140.

At block 404, the computing device 140 filters each waveform in the sequence of waveforms. The computing device 140 can filter or otherwise remove undesirable portions of each waveform of the sequence of waveforms. An example of undesirable portions may include the pressure offset included in each waveform. The computing device 140 may remove the pressure offset of each waveform, each waveform becoming a filtered waveform subsequent to the filtering.

At block 406, the computing device 140 normalizes each waveform in the sequence of waveforms. The computing device 140 may normalize each waveform in the sequence of waveforms based on a predefined criterion, for example to normalize each waveform to a unit energy. The unit energy can be any unit of energy (e.g. Joules, electron volts, etc.) having a magnitude of 1. Normalizing each waveform to the unit energy may enable easy or otherwise more efficient detection of each waveform. Once the waveforms are normalized, the computing device 140 may expect a total of the normalized values from the Golay sequences to be a certain amount. For example, the computing device 140 may expect to detect a total value of 4, or a value of 1 with equal weights of 0.25, from a normalized pair of complementary Golay sequences having four total Golay sequences.

At block 408, the computing device 140 autocorrelates each waveform in the sequence of waveforms. The computing device 140 may autocorrelate each waveform in the sequence of waveforms by inserting a predetermined silence period in each waveform, or the computing device 140 may perform any other suitable autocorrelation function on each waveform. The predetermined silence period may enable the computing device 140 to identify each Golay sequence in the complementary Golay sequence in each waveform. With the inserted predetermined silence period, the complementary Golay sequences may yield a maximum autocorrelation value when aligned or may yield zero when not aligned.

At block 410, the computing device 140 adjusts each waveform to determine an actual data rate for each waveform in the sequence of waveforms. Each waveform of the sequence of waveforms may have a prime number multiplier. The prime number multiplier may be a prime number that is multiplied by, or otherwise applied to, the amplitude or data rate of each waveform for distinguishing each waveform from the other waveforms in the sequence of waveforms. The surface detection system 111 may adjust each waveform by removing the prime number multiplier, and in some examples, the surface detection system 111 may receive the prime number multipliers to remove from each waveform prior to receiving the sequence of waveforms. By removing the prime number multiplier, the computing device 140 may be able to determine the actual data rate of each waveform by dividing an average data rate of the waveforms in the sequence of waveforms by a difference between a start and an end time of each waveform in the sequence of waveforms. In some examples, the surface detection system 111 may additionally or alternatively use pulse width, minimum pulse time, and bit width to determine the actual data rate of each waveform of the sequence of waveforms.

Figure 5:
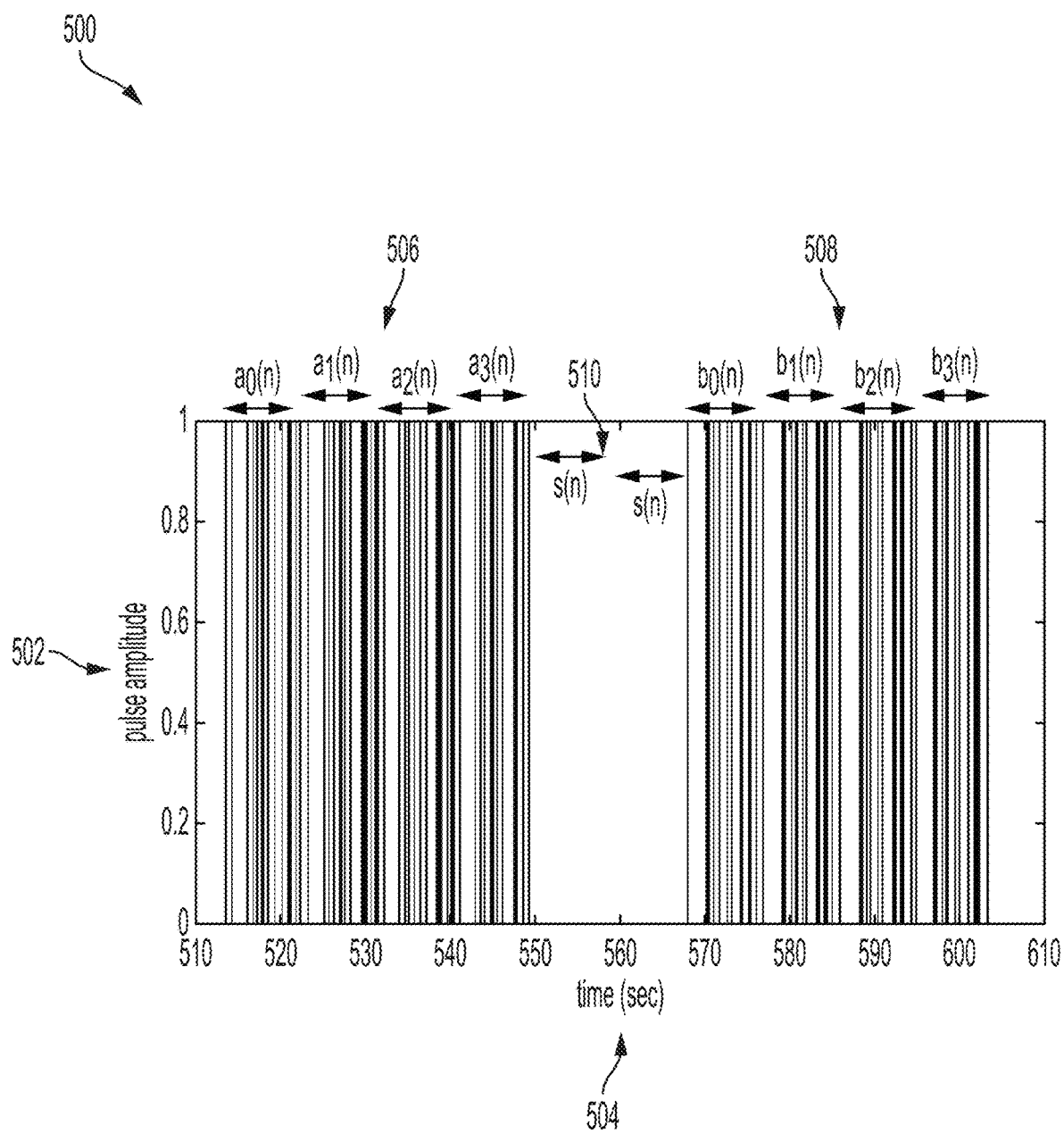
FIG. 5 shows a graph illustrating an example of a waveform that may be included in a sequence of waveforms according to some examples of the present disclosure.

FIG. 5 is a graph 500 illustrating an example of a waveform that may be included in a sequence of waveforms according to some examples of the present disclosure. The graph 500 includes a vertical axis 502 and a horizontal axis 504 representing a pulse amplitude and time in seconds, respectively. The waveform may include two Golay sequences 506, 508. In this example, the two Golay sequences 506, 508 are each of length 128 bits and each include four individual waveforms. In particular, a first Golay sequence 506 includes four individual waveforms that are represented in FIG. 5 as $a_0(n)$-$a_3(n)$. And a second Golay sequence 508 includes four individual waveforms that are represented in FIG. 5 as $b_0(n)$-$b_3(n)$. But in other examples, the Golay sequences 506, 508 may be of other lengths and include more or fewer waveforms.

The amplitudes of the Golay sequences 506, 508 are illustrated as being 1, which may be a result of normalizing the sequences 506, 508 using the processes described above. But in other examples, the amplitudes of the Golay sequences 506, 508 may have different values.

Also included in the waveform is two silence periods 510 that separate the Golay sequences 506, 508 from one another. The silence periods 510 may be inserted by the mud pulser 101 or the computing device 140 for producing unique, time modulated waveforms. As illustrated in the graph 500, there are two silence periods represented by s(n), but any suitable amount of silence periods may be inserted for generating unique waveforms.

In some examples, the computing device 140 may construct or otherwise generate a pre-processed waveform at least in part by using the Golay sequences 506, 508. For example, the computing device 140 may combine the Golay sequences 506, 508 without the silence period 510 to yield a pre-processed waveform with a value of 4.

Figure 6:
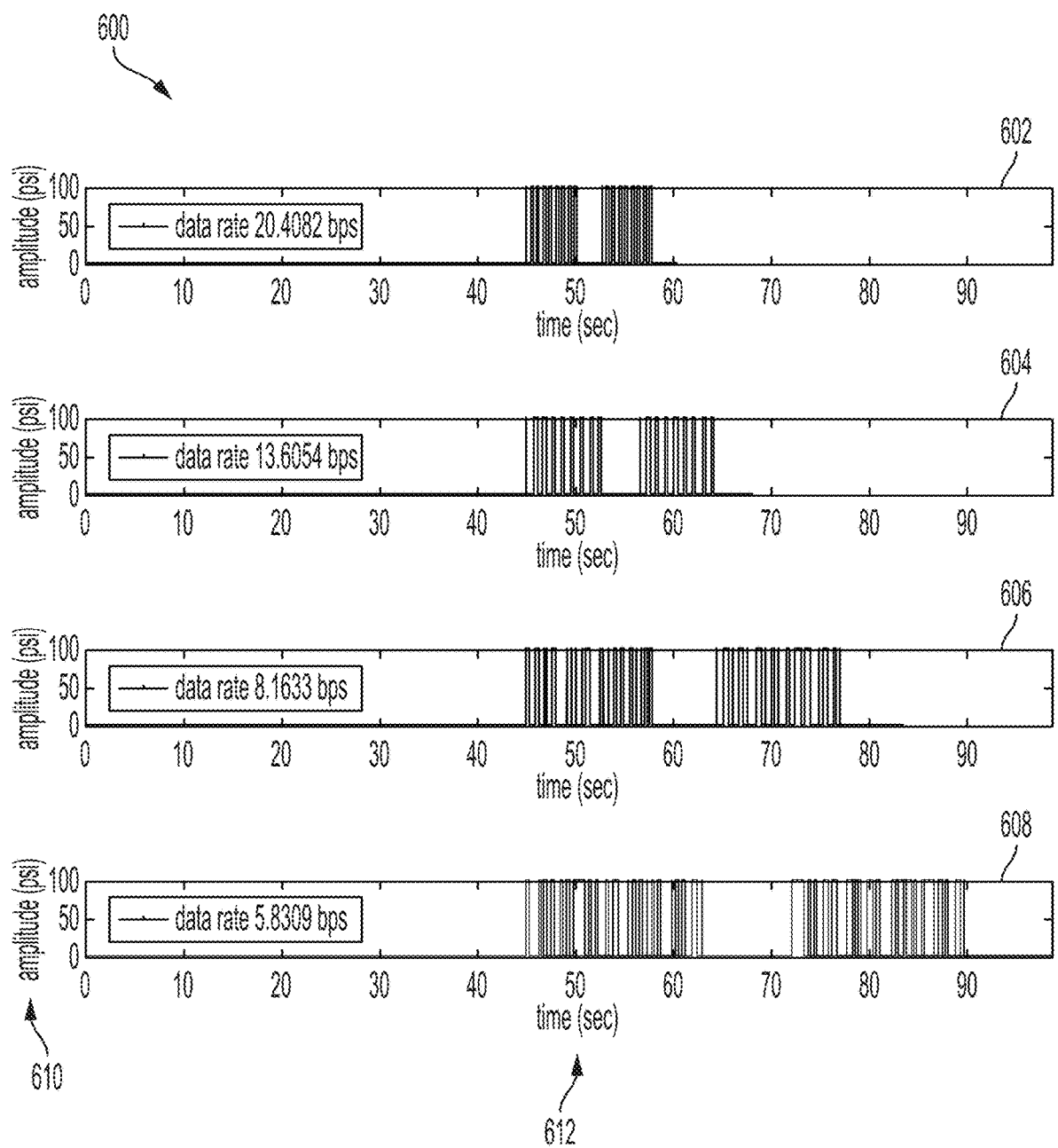
FIG. 6 shows a series of graphs illustrating four examples of waveforms transmitted using different data rates according to some examples of the present disclosure.

FIG. 6 is a series of graphs 600 illustrating four examples of waveforms transmitted using different data rates according to some examples of the present disclosure. The graphs 600 include four sub-graphs 602, 604, 606, and 608, with each sub-graph showing a waveform transmitted at a data rate that is different from the other data rates at which the other waveforms were transmitted. For example, the sub-graph 602 shows a waveform with a data rate of 20.4082 bits per second (or bps), the sub-graph 604 shows a waveform with a data rate of 13.6054 bps, the sub-graph 606 shows a waveform with a data rate of 8.1633 bps, and the sub-graph 608 shows a waveform with a data rate of 5.8309 bps. Each graph of the sub-graphs 602, 604, 606, and 608 includes a vertical axis 610 showing amplitude and a horizontal axis 612 showing time in seconds. The amplitude may be a pressure amount in pounds per square inch (psi).

As shown, the sub-graphs 602, 604, 606, and 608 may each include a complementary Golay sequence that may constitute one waveform in the sequence of waveforms transmitted by the mud pulser 101 to the surface detection system 111. The complementary Golay sequence shown in each graph is separated into its complementary portions with at least one silence period inserted between the complementary portions. The complementary portions of shown in one subgraph may have pulse-widths that are varying or otherwise different from the complementary portions shown in another subgraph. The silence periods may be similar or identical to the silence periods 510 of the graph 500. Additionally or alternatively, the complementary Golay sequence on each graph may be similar or identical to the Golay sequences 506, 508 of the graph 500.

The sub-graphs 602, 604, 606, and 608 may represent a sequence of waveforms transmitted at different data rates, with each sub-graph representing a particular waveform transmitted at a particular date rate. Each individual waveform may include a complementary Golay sequence separated by one or more silence periods, as described above. Although only four waveforms are shown in the four sub-graphs of FIG. 5, more than four or less than four waveforms may be included in the sequences of waveforms. The complementary Golay sequences on each sub-graph can have varying widths, meaning that data contained in the complementary Golay sequences may arrive at the surface detection system 111 at different times. This may be expected since the data rates of the complementary Golay sequences are different. For example, the complementary Golay sequence having the data rate of 5.8309 bps may be received by the surface detection system 111 over a period of 45 seconds. And the complementary Golay sequence having the data rate of 20.4082 bps may be received by the surface detection system 111 over a period of about 15 seconds, which is much quicker as would be expected from a data rate that is around three to four times the slower rate of 5.8309 bps.

Figure 7:
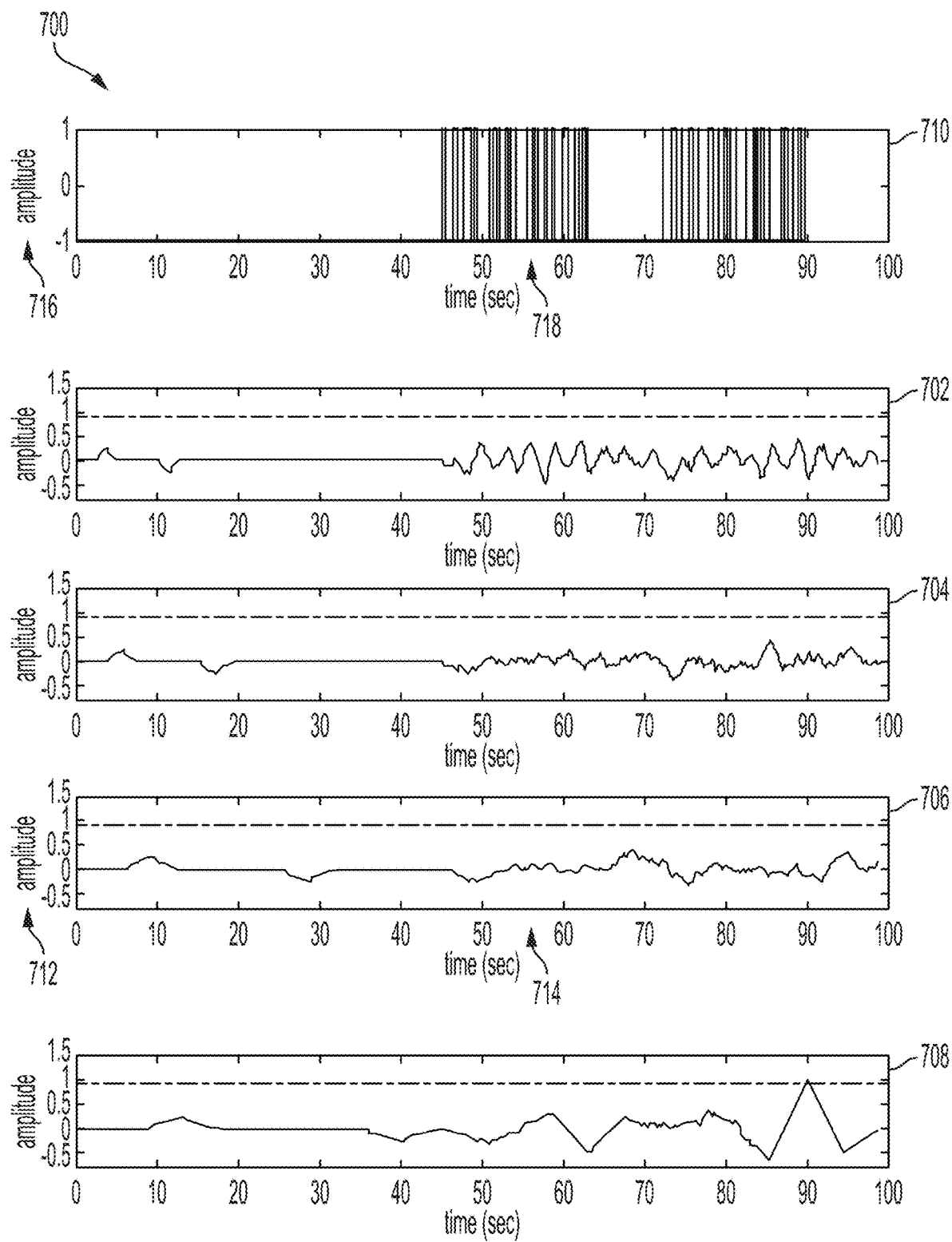
FIG. 7 shows a series of graphs illustrating an example of a set of waveform amplitudes relative to detection thresholds according to some examples of the present disclosure.

FIG. 7 is a series of graphs 700 illustrating an example of a set of waveform amplitudes relative to detection thresholds according to some examples of the present disclosure. The series of graphs 700 includes five sub-graphs 702, 704, 706, 708, and 710. The sub-graph 710 may represent the complementary Golay sequence of a waveform having a data rate of 5.8309 (similar to that of the sub-graph 608) that may be detected by the surface detection system 111. The sub-graphs 702, 704, 706, and 708 may represent pre-processed waveforms having different data rates and may correspond to the sub-graphs 602, 604, 606, and 608 of the graphs 600. A pre-processed waveform can be a pre-processed version of a waveform, for example a version of a waveform that has undergone some or all of the pre-processing steps described with respect to FIG. 4. The sub-graphs 702, 704, 706, and 708 may represent the pre-processed waveforms generated based on the received, unaltered waveforms represented by the sub-graphs 602, 604, 606, and 608. Each graph of the sub-graphs 702, 704, 706, and 708 may include a vertical axis 712 representing amplitude and a horizontal axis 714 representing time in seconds. The sub-graph 710 may include a vertical axis 716 representing a normalized amplitude and a horizontal axis 718 representing time in seconds. As illustrated, the sub-graph 710 depicts the unaltered waveform that corresponds to the pre-processed waveform represented by sub-graph 708. In this example, the pre-processed waveform of sub-graph 708 is the only sequence that equals or exceeds the amplitude threshold.

The computing device 140 may receive data about a sequence of waveforms having any number of waveforms with different data rates. In graph 700, one of the waveforms of the sequence of waveforms is determined to exceed the predefined amplitude threshold by the computing device 140. The other three waveforms may not have amplitudes exceeding the predefined amplitude threshold. As such, the computing device 140 can filter out or ignore the other three waveforms. Once the computing device 140 determines which of the waveforms has an amplitude that meets or exceeds the predefined threshold, computing device can then select a fastest data rate corresponding to one of those waveforms as the optimal data rate. The computing device 140 may then transmit a command to the mud pulser 101 or another component of the well system, for configuring the mud pulser 101 to use the optimal data rate when transmitting subsequent communications. The computing device 140 may also configure the surface detection system 111 to operate using the optimal data rate.

Figure 8:
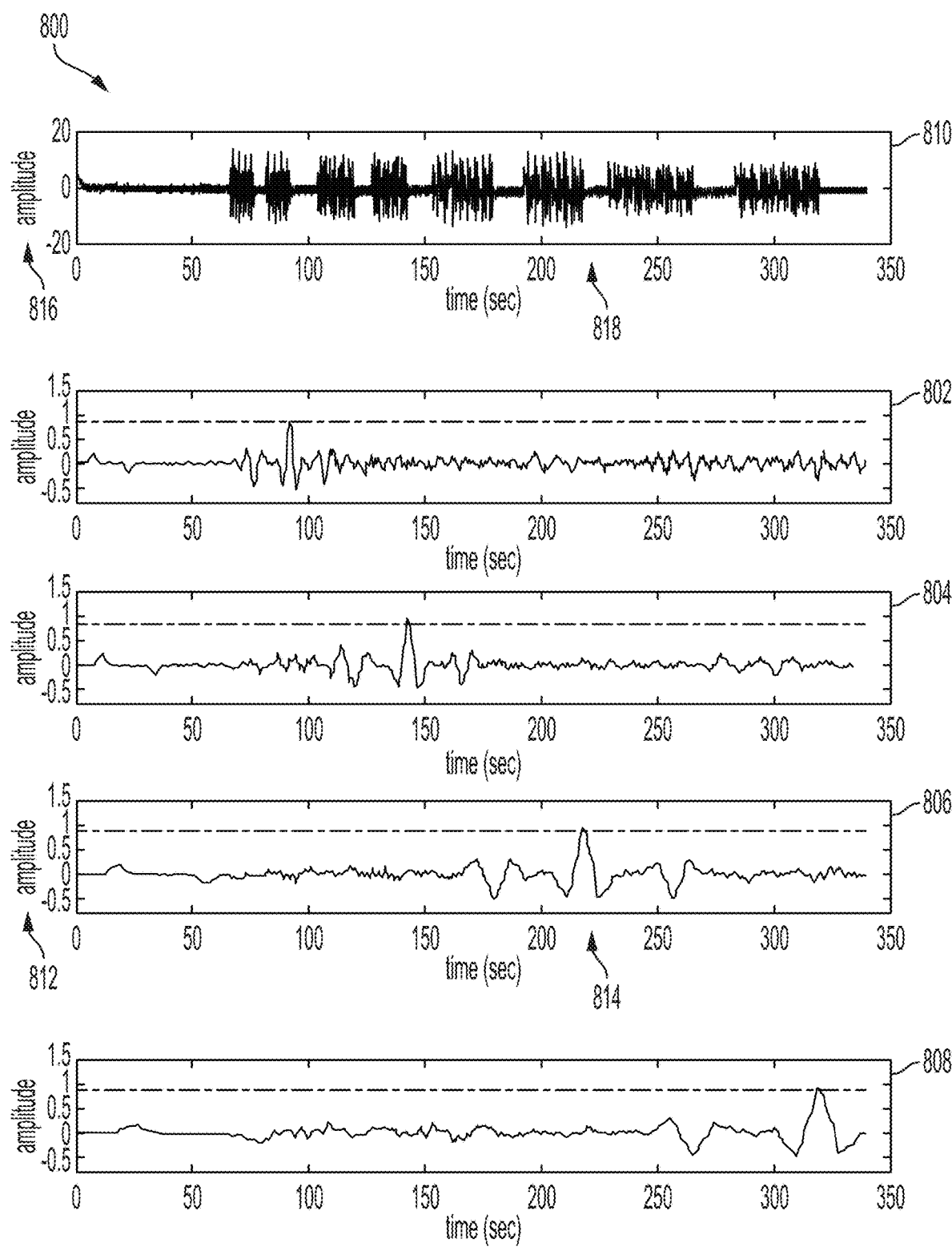
FIG. 8 shows a series of graphs illustrating another example of a set of waveform amplitudes relative to detection thresholds according to some examples of the present disclosure.

FIG. 8 is a series of graphs 800 illustrating another example of a set of waveform amplitudes relative to detection thresholds according to some examples of the present disclosure. The series of graphs 800 includes five sub-graphs 802, 804, 806, 808, and 810. The sub-graph 810 may represent the complementary Golay sequences of each detected waveform of a sequence of waveforms. In the series of graphs 800, there are four detected waveforms. The sub-graphs 802, 804, 806, and 808 may represent pre-processed waveforms having different data rates and, in some examples, may correspond to the sub-graphs 602, 604, 606, and 608 of the graphs 600. The sub-graphs 802, 804, 806, and 808 may represent the pre-processed waveforms of the received, unaltered waveforms represented by the sub-graphs 602, 604, 606, and 608. Each graph of the sub-graphs 802, 804, 806, and 808 may include a vertical axis 812 representing amplitude and a horizontal axis 814 representing time in seconds. The sub-graph 810 may include a vertical axis 816 representing a normalized amplitude and a horizontal axis 818 representing time in seconds. As illustrated, the sub-graph 810 is a concatenation of the sub-graphs 602, 604, 606, and 608 of FIG. 6, which show the unaltered waveforms that correspond to the pre-processed waveforms represented by sub-graphs 802, 804, 806, and 808. In this example, the pre-processed waveforms of sub-graph 802, 804, 806, and 808 each have amplitudes that equal or exceed the amplitude threshold.

The computing device 140 may receive data about a sequence of waveforms having four waveforms with different data rates. In an example represented by the series of graphs 800, none of the four of the waveforms of the sequence of waveforms are filtered out or otherwise ignored by the computing device 140, because all four of the waveforms have amplitudes that meet or exceed the predefined amplitude threshold. Since, in this example, none of the four waveforms may be filtered or otherwise ignored by the computing device 140, the computing device 140 may detect a fastest data rate among data rates of the four waveforms in the sequence of waveforms. Once identified, the fastest data rate may be selected by the computing device 140 as the optimal data rate. In response to identifying and selecting the optimal data rate, the computing device 140 may transmit a command to the mud pulser 101 for causing the mud pulser 101 to adjust itself and use the optimal data rate in subsequent communications. The computing device 140 may also configure the surface detection system 111 to operate using the optimal data rate.

Figure 9:
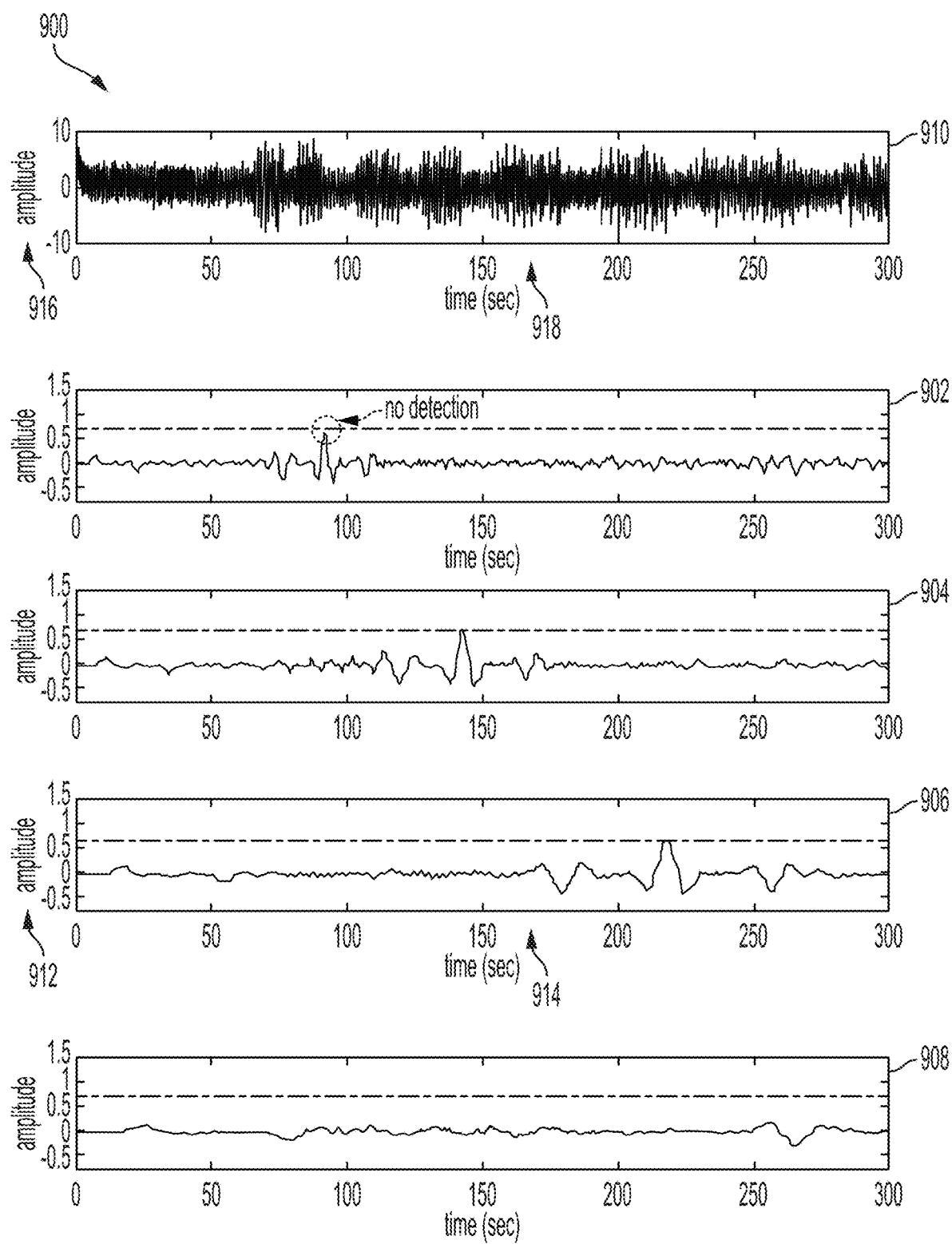
FIG. 9 shows a series of graphs graph illustrating yet another set of waveform amplitudes relative to detection thresholds according to some examples of the present disclosure.

FIG. 9 is a series of graphs 900 illustrating yet another set of waveform amplitudes relative to detection thresholds according to some examples of the present disclosure. The series of graphs 900 includes five sub-graphs 902, 904, 906, 908, and 910. The sub-graph 910 may represent the complementary Golay sequences of each detected waveform in a sequence of waveforms. In the series of graphs 900, there are two detected waveforms. The sub-graphs 902, 904, 906, and 908 may represent pre-processed waveforms having different data rates and, in some examples, may correspond to the sub-graphs 602, 604, 606, and 608 of the graphs 600. The sub-graphs 902, 904, 906, and 908 may represent similar pre-processed waveforms generated based on the received, unaltered waveforms represented by the sub-graphs 602, 604, 606, and 608. Each graph of the sub-graphs 902, 904, 906, and 908 may include a vertical axis 912 representing amplitudes and a horizontal axis 914 representing time in seconds. The sub-graph 910 may include a vertical axis 916 representing a normalized amplitude and a horizontal axis 918 representing time in seconds. As illustrated, the sub-graph 910 can depict a concatenation of sub-graphs 604, 606 of FIG. 6 in their unaltered state.

The computing device 140 may receive data about a sequence of waveforms having four waveforms with different data rates. In an example represented by the series of graphs 900, two of the waveforms of the sequence of waveforms have amplitudes that equal or exceed the predefined threshold, with the waveform of the sequence of waveforms having a fastest data rate not having an amplitude that equals or exceeds the predefined threshold. Each waveform of the sequence of waveforms may have a predefined amplitude threshold applied, and the two waveforms of the sequence of waveforms that do not have amplitudes that meet or exceed the predefined amplitude threshold can be filtered out or otherwise ignored by the computing device 140. Since, in this example, two of the waveforms may be filtered or otherwise ignored by the computing device 140, the computing device 140 may detect a fastest data rate among data rates of the two remaining waveforms in the sequence of waveforms having amplitudes that equal or exceed the predefined threshold. Once identified, the fastest data rate may be selected by the computing system 140 as the optimal data rate. In response to identifying and selecting the optimal data rate, the computing device 140 may transmit a command to the mud pulser 101 for causing the mud pulser 101 to adjust itself and use the optimal data rate in subsequent communications. The computing device 140 may also configure the surface detection system 111 to operate using the optimal data rate. In the example shown in FIG. 9, the optimal data rate is not the fastest data rate among all of the waveforms of the sequence of waveforms.

Figure 10:
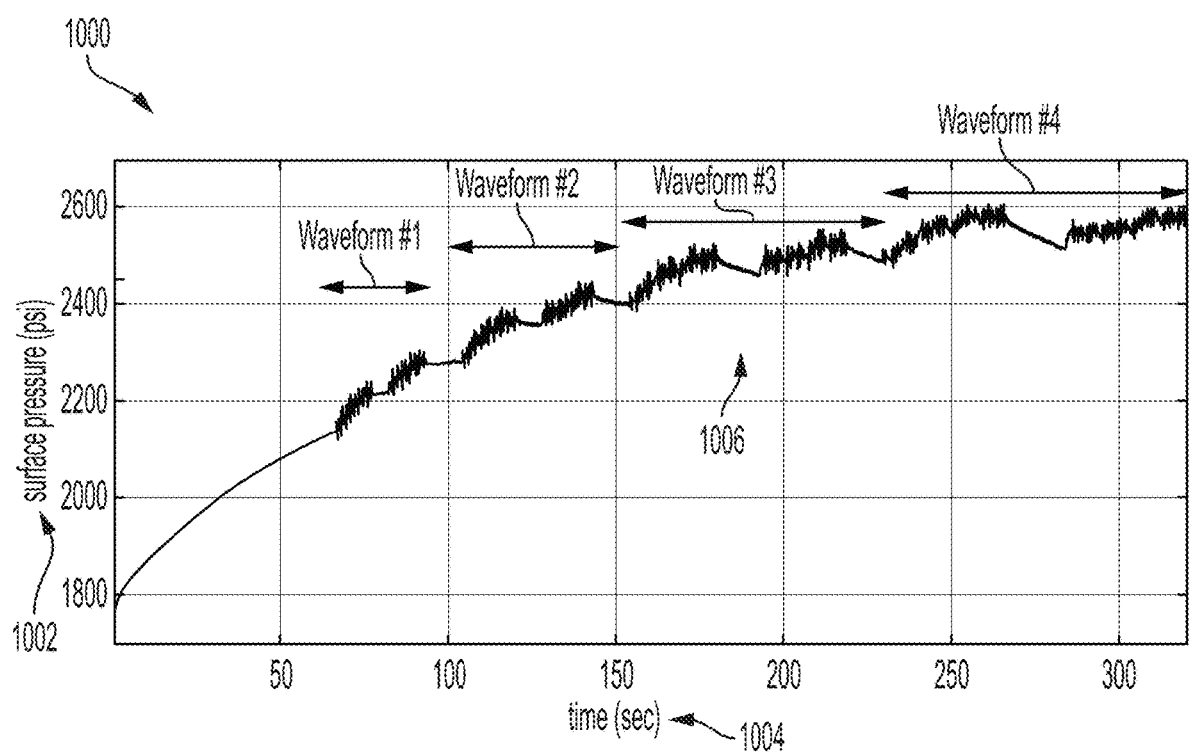
FIG. 10 is a graph illustrating an example of a set of waveforms according to some examples of the present disclosure.

FIG. 10 is a graph 1000 illustrating an example of a set of waveforms according to some examples of the present disclosure. As illustrated, the graph 1000 includes a vertical axis 1002 that represents downhole pressure, measured at the surface 110 in psi. The graph 1000 also includes a horizontal axis 1004 representing time in seconds. The graph 1000 may be a simulation of the mud pulser 101 modifying mud flow downhole in the wellbore 118 and transmitting a sequence of four waveforms to the surface detection system 111. The four waveforms may have different data rates resulting in the difference in time of detection. Additionally or alternatively, the four waveforms may have different amplitudes or amplitude ranges from one another. In some examples, the computing device 140 can analyze the amplitudes of all four of the waveforms to determine which, if any, of the waveforms have amplitudes that meet or exceed a predefined amplitude threshold. If none of the waveforms have amplitudes that meet or exceed the predefined amplitude threshold, it may indicate that all of the data rates are insufficient for use in data communications between the mud pulser 101 and the surface detection system 111. The computing device may then indicate such information to a well operator. Based on such information, the well operator can take appropriate steps to adjust the mud pulser 101, the surface detection system 111, a characteristic of the mud, or a characteristic of the wellbore in an attempt to improve the data communications between the mud pulser 101 and the surface detection system 111.

In some aspects, systems, methods, and non-transitory computer-readable mediums for optimizing and synchronizing data rates for mud-pulse telemetry in a wellbore are provided according to one or more of the following examples. As used below, any reference to a series of examples is to be understood as a reference to each of those examples disjunctively (e.g., "Examples 1-4" is to be understood as "Examples 1, 2, 3, or 4").

Example 1 is a system comprising: a mud pulser positionable in a wellbore, the mud pulser being configured to transmit a sequence of waveforms at a plurality of data rates to a detection system for synchronizing the mud pulser with the detection system prior to the mud pulser engaging in data communications with the detection system. Each waveform in the sequence of waveforms can be transmitted by the mud pulser at a particular data rate in the plurality of data rates that is different from the other data rates of the other waveforms in the sequence of waveforms. The system can also include the detection system positionable at a well surface. The detection system can include a processor and a memory. The memory can comprise instructions that are executable by the processor to cause the processor to: receive the sequence of waveforms transmitted at the plurality of data rates by the mud pulser; determine one or more waveforms, in the sequence of waveforms, having amplitudes exceeding a predefined threshold; determine which waveform of the one or more waveforms has a fastest data rate among the plurality of data rates; and select the fastest data rate for use in subsequent data communications with the mud pulser.

Example 2 is the system of Example 1, wherein the memory of the detection system further comprises instructions executable by the processor to cause the processor to transmit a signal configured to cause an operational setting of the mud pulser to be adjusted such that the subsequent data communications are transmitted by the mud pulser at the fastest data rate.

Example 3 is the system of any of Examples 1-2, wherein each waveform in the sequence of waveforms includes a complementary Golay sequence of mud pulses having varying pulse-width values and varying silence periods, and wherein the memory of the detection system further comprises instructions that are executable by the processor to cause the processor to: perform autocorrelation on each waveform in the sequence of waveforms by inserting a pre-set silence period into the waveform and normalizing the waveform according to a predefined criterion; and compare an output of the autocorrelation to the predefined threshold.

Example 4 is the system of any of Examples 1-3, wherein the mud pulser is configured to transmit the sequence of waveforms in descending order of data rate.

Example 5 is the system of any of Examples 1-4, wherein the mud pulser is configured to pulse-width modulate and time modulate each waveform in the sequence of waveforms, the mud pulser being configured to time modulate each waveform in the sequence of waveforms based on a minimum pulse time, a bit width, and a pulse width for generating the waveform at the particular data rate of the plurality of data rates.

Example 6 is the system of any of Examples 1-5, wherein the memory further comprises instructions that are executable by the processor to cause the processor to: filter each waveform in the sequence of waveforms by removing a pressure offset from the waveform to yield a filtered waveform; and adjust each filtered waveform in the sequence of waveforms by removing prime number multipliers for determining an actual data rate of each waveform of the sequence of waveforms.

Example 7 is the system of any of Examples 1-6, wherein the memory further comprises instructions that are executable by the processor to cause the processor to: determine an average data rate of the sequence of waveforms using pulse width, minimum pulse time, and bit width; and calculate the actual data rate using the average data rate.

Example 8 is a method comprising: receiving, by a computing device, data about a sequence of waveforms transmitted at a plurality of data rates by a mud pulser. Each waveform in the sequence of waveforms can be transmitted by the mud pulser at a particular data rate in the plurality of data rates that is different from the other data rates of the other waveforms in the sequence of waveforms. The method also includes determining, by the computing device, one or more waveforms in the sequence of waveforms having amplitudes exceeding a predefined threshold. The method further includes determining, by the computing device, a waveform of the one or more waveforms that has a fastest data rate among the plurality of data rates. And the method includes selecting, by the computing device, the fastest data rate for use in subsequent data communications with the mud pulser.

Example 9 is the method of Example 8, further comprising transmitting a signal configured to cause an operational setting of the mud pulser to be adjusted such that the subsequent data communications are transmitted by the mud pulser at the fastest data rate.

Example 10 is the method of any of Examples 8-9, wherein each waveform in the sequence of waveforms includes a complementary Golay sequence of mud pulses having varying pulse-width values and varying silence periods, and further comprising: auto-correlating each waveform in the sequence of waveforms by inserting a pre-set silence period into the waveform and normalizing the waveform according to a predefined criterion; and comparing an output of the autocorrelation to a predefined threshold.

Example 11 is the method of any of Examples 8-10, further comprising: receiving, by the computing device, the subsequent data communications from the mud pulser at the fastest data rate.

Example 12 is the method any of Examples 8-11, wherein each waveform in the sequence of waveforms has a unique pulse width in the sequence of waveforms, and wherein the mud pulser is configured to time modulate each waveform in the sequence of waveforms based on a minimum pulse time, bit width, and pulse width for generating a waveform at the particular data rate of the plurality of data rates.

Example 13 is the method any of Examples 8-12, further comprising: filtering, by the computing device, each waveform in the sequence of waveforms by removing a pressure offset to yield a filtered waveform; and adjusting, by the computing device, each of the filtered waveforms in the sequence of waveforms by removing prime number multipliers for determining an actual data rate of each waveform of the sequence of waveforms.

Example 14 is the method of any of Examples 8-13, further comprising: determining, by the computing device, an average data rate of the sequence of waveforms using pulse width, minimum pulse time, and bit width; and calculating, by the computing device, the actual data rate using the average data rate.

Example 15 is a non-transitory computer-readable medium comprising instructions that are executable by a processing device for causing the processing device to perform operations comprising: receiving data about a sequence of waveforms transmitted at a plurality of data rates by a mud pulser, each waveform in the sequence of waveforms being transmitted by the mud pulser at a particular data rate in the plurality of data rates that is different from the other data rates of the other waveforms in the sequence of waveforms; determining one or more waveforms, in the sequence of waveforms, having amplitudes exceeding a predefined threshold; determining a waveform of the one or more waveforms that has a fastest data rate among the plurality of data rates; and selecting the fastest data rate for use in subsequent data communications with the mud pulser.

Example 16 is the non-transitory computer-readable medium of Example 15, wherein the non-transitory computer-readable medium further comprises instructions executable by the processing device to cause the processing device to transmit a signal configured to cause an operational setting of the mud pulser to be adjusted such that the subsequent data communications are transmitted by the mud pulser at the fastest data rate.

Example 17 is the non-transitory computer-readable medium of any of Examples 15-16, wherein each waveform in the sequence of waveforms includes a complementary Golay sequence of mud pulses having varying pulse-width values and varying silence periods, and wherein the non-transitory computer-readable medium further comprises instructions that are executable by the processing device to cause the processing device to: perform autocorrelation on each waveform in the sequence of waveforms by inserting a pre-set silence period into the waveform and normalizing the waveform according to a predefined criterion; and apply an output of the autocorrelation to the predefined threshold.

Example 18 is the non-transitory computer-readable medium of any of Examples 15-17, wherein the non-transitory computer-readable medium further comprises instructions that are executable by the processing device to cause the processing device to synchronize a data rate for data communications between the mud pulser and the processing device based on the sequence of waveforms.

Example 19 is the non-transitory computer-readable medium of any of Examples 15-18, wherein each waveform in the sequence of waveforms has a unique pulse width in the sequence of waveforms, and wherein the mud pulser is configured to time modulate each waveform in the sequence of waveforms based on a minimum pulse time, bit width, and pulse width for generating a waveform at the particular data rate of the plurality of data rates.

Example 20 is the non-transitory computer-readable medium of any of Examples 15-19, wherein the non-transitory computer-readable medium further comprises instructions that are executable by the processing device to cause the processing device to: determine an average data rate of the sequence of waveforms using pulse width, minimum pulse time, and bit width; and calculate an actual data rate using the average data rate.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A system comprising:
a mud pulser positionable in a wellbore to transmit a sequence of waveforms at a plurality of data rates to a detection system for synchronizing the mud pulser with the detection system prior to the mud pulser engaging in data communications with the detection system, each waveform in the sequence of waveforms being transmitted by the mud pulser at a particular data rate in the plurality of data rates that is different from the other data rates of the other waveforms in the sequence of waveforms; and
the detection system positionable at a well surface, the detection system including a processor and a memory, the memory comprising instructions that are executable by the processor to cause the processor to:
receive the sequence of waveforms transmitted at the plurality of data rates by the mud pulser;
filter each waveform in the sequence of waveforms by removing a pressure offset from the waveform to yield a filtered waveform;
adjust each filtered waveform in the sequence of waveforms by removing multipliers for determining an actual data rate of each waveform of the sequence of waveforms, the actual data rate of each waveform being one of the plurality of data rates;
determine one or more waveforms, in the sequence of waveforms, having amplitudes exceeding a predefined threshold;
determine which waveform of the one or more waveforms has a fastest data rate among the plurality of data rates; and
select the fastest data rate for use in subsequent data communications with the mud pulser.

2. The system of claim 1, wherein the memory of the detection system further comprises instructions executable by the processor to cause the processor to transmit a signal configured to cause an operational setting of the mud pulser to be adjusted such that the subsequent data communications are transmitted by the mud pulser at the fastest data rate.

3. The system of claim 1, wherein each waveform in the sequence of waveforms includes a complementary Golay sequence of mud pulses having varying pulse-width values and varying silence periods, and wherein the memory of the detection system further comprises instructions that are executable by the processor to cause the processor to:
perform autocorrelation on each waveform in the sequence of waveforms by inserting a pre-set silence period into the waveform and normalizing the waveform according to a predefined criterion; and
compare an output of the autocorrelation to the predefined threshold.

4. The system of claim 1, wherein the mud pulser is configured to transmit the sequence of waveforms in descending order of data rate.

5. The system of claim 1, wherein the mud pulser is configured to pulse-width modulate and time modulate each waveform in the sequence of waveforms, the mud pulser being configured to time modulate each waveform in the sequence of waveforms based on a minimum pulse time, a bit width, and a pulse width for generating the waveform at the particular data rate of the plurality of data rates.

6. The system of claim 1, wherein the memory further comprises instructions that are executable by the processor to cause the processor to:
  determine an average data rate of the sequence of waveforms using pulse width, minimum pulse time, and bit width; and
  calculate the actual data rate using the average data rate.

7. The system of claim 1, wherein the memory of the detection system further comprises instructions executable by the processor to cause the processor to filter out a waveform from the sequence of waveforms that is below the predefined threshold.

8. The system of claim 1, wherein the memory of the detection system further comprises instructions executable by the processor to cause the processor to output data rates to an operator on a display.

9. A method comprising:
  receiving, by a computing device, data about a sequence of waveforms transmitted at a plurality of data rates by a mud pulser, each waveform in the sequence of waveforms being transmitted by the mud pulser at a particular data rate in the plurality of data rates that is different from the other data rates of the other waveforms in the sequence of waveforms;
  determining, by the computing device, one or more waveforms in the sequence of waveforms having amplitudes exceeding a predefined threshold;
  filtering, by the computing device, each waveform in the sequence of waveforms by removing a pressure offset from the waveform to yield a filtered waveform;
  adjusting, by the computing device, each filtered waveform in the sequence of waveforms by removing multipliers for determining an actual data rate of each waveform of the sequence of waveforms, the actual data rate of each waveform being one of the plurality of data rates;
  determining, by the computing device, a waveform of the one or more waveforms that has a fastest data rate among the plurality of data rates;
  selecting, by the computing device, the fastest data rate for use in subsequent data communications with the mud puller; and
  transmitting, by the computing device, a signal configured to cause an operational setting of the mud pulser to be adjusted such that the subsequent data communications are transmitted by the mud pulser at the fastest data rate.

10. The method of claim 9, wherein each waveform in the sequence of waveforms includes a complementary Golay sequence of mud pulses having varying pulse-width values and varying silence periods, and further comprising:
  auto-correlating each waveform in the sequence of waveforms by inserting a pre-set silence period into the waveform and normalizing the waveform according to a predefined criterion; and
  comparing an output of the autocorrelation to the predefined threshold.

11. The method of claim 9, further comprising:
  receiving, by the computing device, the subsequent data communications from the mud pulser at the fastest data rate.

12. The method of claim 9, wherein each waveform in the sequence of waveforms has a unique pulse width in the sequence of waveforms, and wherein the mud pulser is configured to time modulate each waveform in the sequence of waveforms based on a minimum pulse time, bit width, and pulse width for generating a waveform at the particular data rate of the plurality of data rates.

13. The method of claim 9, further comprising:
  determining, by the computing device, an average data rate of the sequence of waveforms using pulse width, minimum pulse time, and bit width; and
  calculating, by the computing device, the actual data rate using the average data rate.

14. A non-transitory computer-readable medium comprising instructions that are executable by a processing device for causing the processing device to perform operations comprising:
  receiving data about a sequence of waveforms transmitted at a plurality of data rates by a mud pulser, each waveform in the sequence of waveforms being transmitted by the mud pulser at a particular data rate in the plurality of data rates that is different from the other data rates of the other waveforms in the sequence of waveforms;
  determining one or more waveforms, in the sequence of waveforms, having amplitudes exceeding a predefined threshold;
  filtering each waveform in the sequence of waveforms by removing a pressure offset from the waveform to yield a filtered waveform;
  adjusting each filtered waveform in the sequence of waveforms by removing multipliers for determining an actual data rate of each waveform of the sequence of waveforms, the actual data rate of each waveform being one of the plurality of data rates;
  determining a waveform of the one or more waveforms that has a fastest data rate among the plurality of data rates;
  selecting the fastest data rate for use in subsequent data communications with the mud pulser; and
  transmitting a signal configured to cause an operational setting of the mud pulser to be adjusted such that the subsequent data communications are transmitted by the mud pulser at the fastest data rate.

15. The non-transitory computer-readable medium of claim 14, wherein each waveform in the sequence of waveforms includes a complementary Golay sequence of mud pulses having varying pulse-width values and varying silence periods, and wherein the non-transitory computer-readable medium further comprises instructions that are executable by the processing device to cause the processing device to:
  perform autocorrelation on each waveform in the sequence of waveforms by inserting a pre-set silence period into the waveform and normalizing the waveform according to a predefined criterion; and
  apply an output of the autocorrelation to the predefined threshold.

16. The non-transitory computer-readable medium of claim 14, wherein the non-transitory computer-readable medium further comprises instructions that are executable by the processing device to cause the processing device to synchronize a data rate for data communications between the mud pulser and the processing device based on the sequence of waveforms.

17. The non-transitory computer-readable medium of claim 14, wherein each waveform in the sequence of waveforms has a unique pulse width in the sequence of waveforms, and wherein the mud pulser is configured to time modulate each waveform in the sequence of waveforms based on a minimum pulse time, bit width, and pulse width for generating a waveform at the particular data rate of the plurality of data rates.

18. The non-transitory computer-readable medium of claim 14, wherein the non-transitory computer-readable medium further comprises instructions that are executable by the processing device to cause the processing device to:
   determine an average data rate of the sequence of waveforms using pulse width, minimum pulse time, and bit width; and
   calculate an actual data rate using the average data rate.

19. The non-transitory computer-readable medium of claim 14, wherein the non-transitory computer-readable medium further comprises instructions that are executable by the processing device to cause the processing device to filter out a waveform from the sequence of waveforms that is below the predefined threshold.

20. The non-transitory computer-readable medium of claim 14, wherein the non-transitory computer-readable medium further comprises instructions that are executable by the processing device to cause the processing device to output data rates to an operator on a display.

* * * * *